United States Patent [19]
Wood et al.

[11] Patent Number: 5,302,891
[45] Date of Patent: Apr. 12, 1994

[54] DISCRETE DIE BURN-IN FOR NON-PACKAGED DIE

[75] Inventors: Alan G. Wood; Tim J. Corbett; Gary L. Chadwick; Chender Huang; Larry D. Kinsman, all of Boise, Id.

[73] Assignee: Micron Technology, Inc., Boise, Id.

[21] Appl. No.: 973,931

[22] Filed: Nov. 10, 1992

Related U.S. Application Data

[63] Continuation of Ser. No. 709,858, Jun. 4, 1991, abandoned.

[51] Int. Cl.⁵ .................. G01R 31/02; G01R 1/073
[52] U.S. Cl. ......................... 324/158 F; 324/158 P
[58] Field of Search ............... 324/158 F, 158 P, 72.5, 324/73.1

[56] References Cited

U.S. PATENT DOCUMENTS

| | | | |
|---|---|---|---|
| 4,069,453 | 1/1978 | Veenendahl | 324/158 F |
| 4,324,040 | 4/1982 | Gottlieb | 324/158 F |
| 4,340,860 | 7/1982 | Teeple, Jr. | 324/158 F |
| 4,554,505 | 11/1985 | Zackry | 324/158 F |
| 4,675,599 | 6/1987 | Jensen et al. | 324/158 F |
| 4,683,423 | 7/1987 | Morton | 324/158 F |
| 4,683,425 | 7/1987 | Tossutto et al. | 324/158 F |
| 4,686,468 | 8/1987 | Lee et al. | 324/158 F |
| 4,725,918 | 2/1988 | Bakker | 324/158 F |
| 4,739,257 | 4/1988 | Jenson et al. | 324/158 F |
| 4,760,335 | 7/1988 | Lindberg | 324/158 F |
| 4,843,313 | 6/1989 | Walton | 324/158 F |
| 4,899,107 | 2/1990 | Corbett et al. | 324/158 |
| 4,956,605 | 9/1990 | Bickford et al. | 324/158 F |
| 4,970,460 | 11/1990 | Jensen et al. | 324/158 F |
| 4,987,365 | 1/1991 | Shreeve et al. | 324/158 F |
| 4,996,476 | 2/1991 | Balyasny et al. | 324/158 F |

Primary Examiner—Ernest F. Karlsen
Attorney, Agent, or Firm—Stanley N. Protigal

[57] ABSTRACT

A reusable burn-in/test fixture for discrete die consists of two halves. The first half of the test fixture contains cavity in which die is inserted. When the two halves are assembled, the fixture establishes electrical contact with the die and with a burn-in oven. The test fixture need not be opened until the burn-in and electrical test are completed. The fixture permits the die to be characterized prior to assembly.

43 Claims, 8 Drawing Sheets

DISCRETE DIE BURN-IN FOR NON-PACKAGED DIE

This application is a continuation of application Ser. No. 07/709,858 filed Jun. 4, 1991, now abandoned.

FIELD OF THE INVENTION

This invention relates to electrical test equipment for semiconductor devices. More specifically, the invention relates to an apparatus and method to perform dynamic burn-in and full electrical/performance/speed testing on discrete nonpackaged or semi-packaged dice.

BACKGROUND OF THE INVENTION

Semiconductor devices are subjected to a series of test procedures in order to assure quality and reliability. This testing procedure conventionally includes "probe testing", in which individual dice, while still on a wafer, are initially tested to determine functionality and speed. Probe cards are used to electrically test die at that level. The electrical connection interfaces with only a single die at a time in wafer; not discrete die.

If the wafer has a yield of functional dice which indicates that quality of the functional dice is likely to be good, each individual die is assembled in a package to form a semiconductor device. Conventionally, the packaging includes a lead frame and a plastic or ceramic housing.

The packaged devices are then subjected to another series of tests, which include burn-in and discrete testing. Discrete testing permits the devices to be tested for speed and for errors which may occur after assembly and after burn-in. Burn-in accelerates failure mechanisms by electrically exercising the devices (UUT) at elevated temperatures, thus eliminating potential failures which would not otherwise be apparent at nominal test conditions.

Variations on these procedures permit devices assembled onto circuit arrangements, such as memory boards, to be burned-in, along with the memory board in order to assure reliability of the circuit, as populated with devices. This closed assembly testing assumes that the devices are discretely packaged in order that it can then be performed more readily.

It is proposed that multiple integrated circuit devices be packaged as a single unit. This can be accomplished with or without conventional lead frames. This creates two problems for being conventional test methods. Firstly, discrete testing is more difficult because the conventional lead frame package is not used. Furthermore, when multiple devices are assembled into a single package, the performance of the package is reduced to that of the die with the lowest performance. In other words, the ability to presort the individual dice is limited that obtained through probe testing. Secondly, the packaging may have other limitations which are aggravated by burn-in stress conditions so that the packaging becomes a limitation for burn-in testing.

A form of hybrid integrated circuit incorporates a plurality of dice in a single package. This increases density of packaging and permits matched components on different dice to be packaged as a single part. The yield rate of such an assembly is likely to be at least a multiple of the yield rates of its component dice. As mentioned, if performance of the dice is factored in, the yield is likely to become significantly lower than the multiple of the component yield rates.

On the other hand, if the test results of burned in dice are available, the component yield rates can be increased. It is further possible to match components by matching various characterizations (such as signal timing and response times), thereby providing more margin for proper response.

Such hybrid integrated circuits, as well as other configurations establish a need for burned in semiconductor dice. Ideally, it would be desirable to permit testing of individual dice in a manner similar to that accomplished with discrete packaged semiconductor devices.

In U.S. Pat. No. 4,899,107, commonly assigned, a reusable burn-in/test fixture for discrete TAB die is provided. The fixture consists of two halves, one of which is a die cavity plate for receiving semiconductor dice as the units under test (UUT); and the other half establishes electrical contact with the dice and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dice.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

TAB tape is normally bonded at bondpads in order to establish electrical connections which exhibits long term reliability without requiring that external pressure be applied to the assembly. The bonding of the TAB tape establishes a mechanical connection which can cause the bond pads to lift off of (become detached from) the die when the TAB tape is removed.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

SUMMARY OF THE INVENTION

It has been found desireable to perform testing and related procedures in discrete fixtures prior to final assembly. In order to accomplish this, a two piece reusable burn-in/test fixture for discrete die is provided. The fixture consists of two halves, one of which is a die cavity plate for receiving a semiconductor die as the units under test (UUT).

In a first embodiment, a die is placed face up in a cavity in a first half of the fixture. A die contact member is used to establish contact with bondpads on the die, and to conduct between the bondpads and external connector leads on the fixture.

The contact between the bondpads and the external connector leads is preferably established by utilizing non-bonded TAB (tape automated bonding) technology. Conductors on the non-bonded TAB tape extend from the bondpads to connection points, and the connection points conduct to contacts, which are in turn in communication with the external connector leads.

The non-bonded TAB tape is essentially similar to conventional TAB interconnect methods, except that its connection function may be performed without permanently bonding the TAB tape to the die. In order to maintain contact with circuitry on the die, the non-bonded TAB tape is biased against the die when the burn-in/test fixture is assembled. The non-bonded contact of the non-bonded TAB tape applies primarily to the die pads. Contact between the tape and other conductors may also be non-bonded contact, although the attachment of the TAB tape to the fixture may be effected either without permanent bonding, or by bonding techniques. The non-bonded TAB tape is biased against the die, preferably by a compressible elastomeric pad.

In the preferred form of that embodiment, the external connector leads are connector pins, which preferably are in a DIP (dual inline plug) or QFP (quad flat pack) configuration. The pins terminate as the connection points.

In an alternate form of that embodiment, the conductors on the non-bonded TAB tape conduct to the top of the tape, and attachment of the second half of the fixture establishes an electrical connection between the conductors and the external connection leads, either through the second half or through a separate conductor.

The fixture establishes electrical contact with the a single die and with a burn-in oven, as well as permitting testing of dice in discretely packaged form.

In another embodiment of the invention, a two piece reusable burn-in/test fixture for discrete die is provided. The first half of the test fixture contains a cavity in which a die is inserted circuit side up. The die will rest on a floating platform. The second half has a probe for each die pad. Each probe is connected to an electrical connector which can be used for attachment to a burn-in board and may be used for connection to a discrete circuit tester.

The probes can take several forms. Deposited conductors would be similar to the use of non-bonded TAB tape, except that the deposited conductors could be located on a fixed substrate. Conductive elastomers may be used, in which the conductive elastomer is used to establish electrical communication between the die, at the bondpads, and the external connection leads. Biased metal probes, such as probe wires, may be used.

In a third embodiment, the die is placed face up in a cavity in a first half of the fixture. A second half of the fixture includes external connector leads and is used to establish contact with bondpads on the die. Attachment of the die to the external connection leads is established either through contact points on the second half, or through an intermediate member, such as a non-bonded TAB tape.

In a fourth embodiment, the die is placed face down in a fixture which includes die receiving cavity. Contact with bondpads on the die are established in order that the bondpads are in electrical communication with external connector leads on the fixture.

In that embodiment, the probes and the electrical connector are located on the second half. In the preferred form of that embodiment, the electrical connector extends upward from the face of the circuit side of the die, so that the fixture is normally connected to a tester with the integrated circuit side of the die facing down.

DETAILED DESCRIPTION OF THE PREFERRED EMBODIMENT

Figure 1:
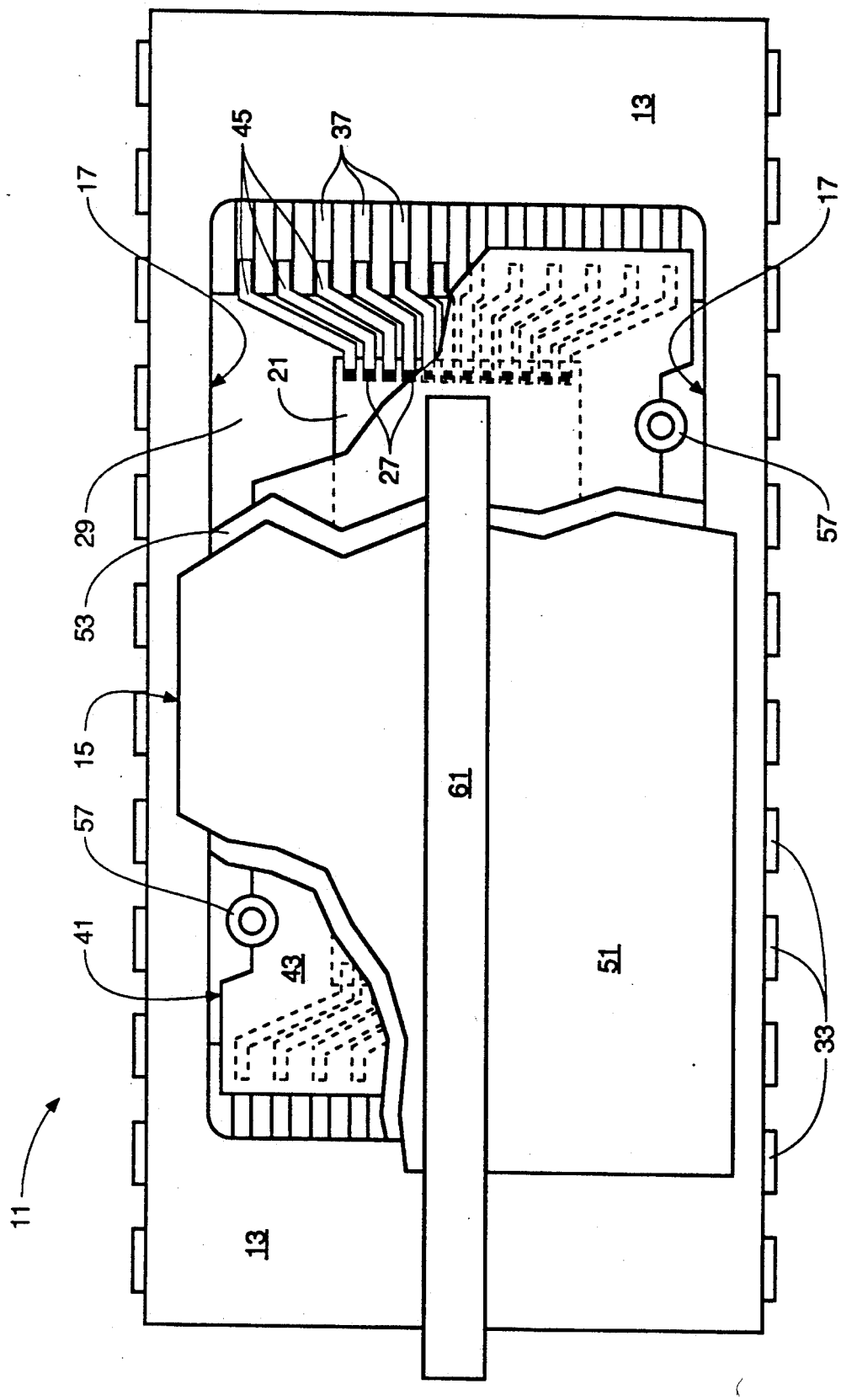
FIGS. 1 and 2 show a preferred embodiment of the inventive burn-in fixture.
Figure 2:
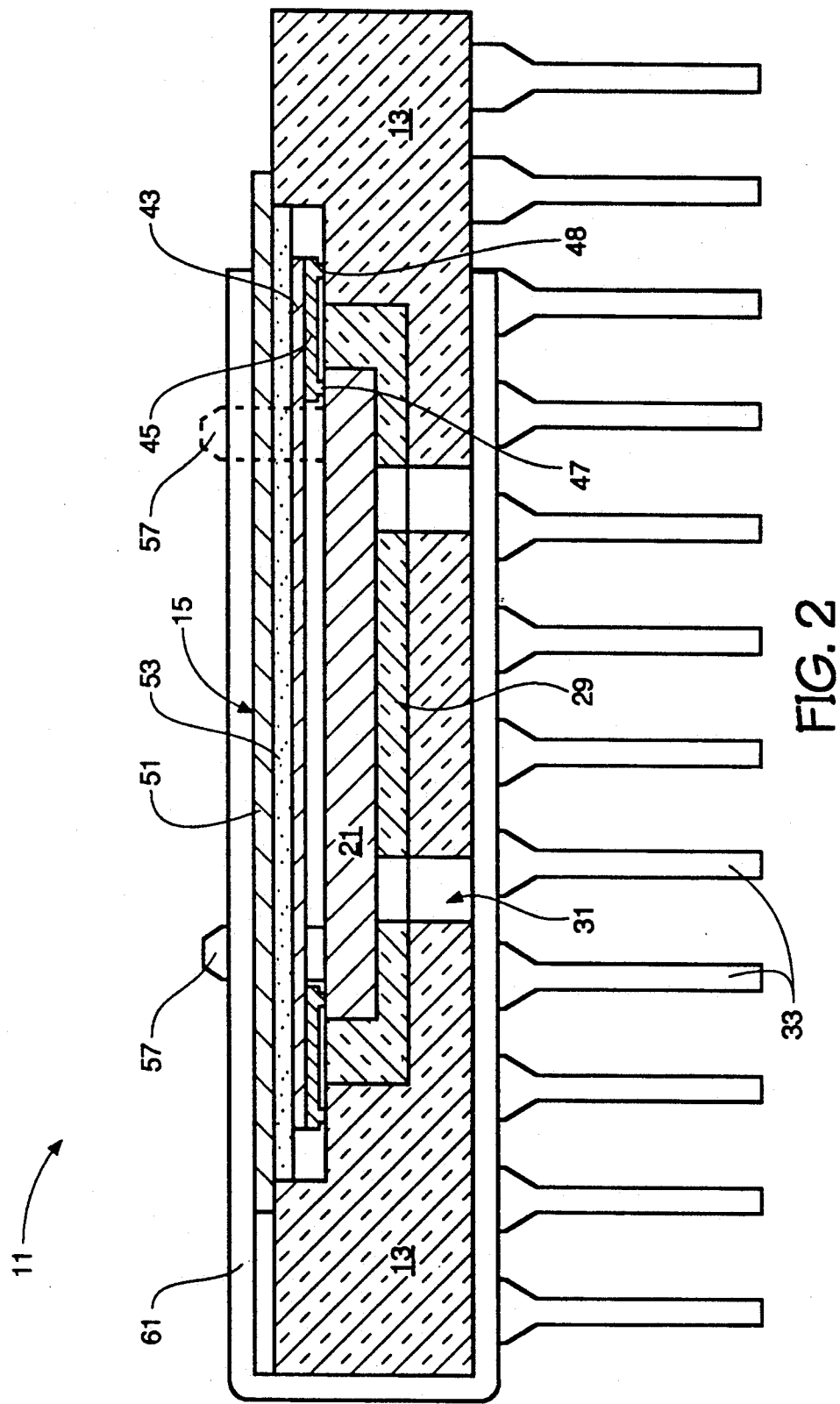

Referring to FIGS. 1 and 2, the inventive burn-in fixture 11 includes a die cavity plate, 13 and a cover 15. The die cavity plate 13 includes a die receiving cavity 17.

The die receiving cavity 17 has dimensions which are at least sufficient to accommodate a die 21. The die 21 is to be connected at bondpads 27, which are typically 0.1 mm wide. For this reason, it is advantageous to provide a spacer plate 29 which fits within the die receiving cavity 17 and the die 21, and which precisely positions the die 21 for subsequent alignment. The die cavity plate also has a slot 31 which permits convenient access to the bottom of the die 21 in order that the die 21 may be lifted out of the die receiving cavity 21.

A plurality of external connector leads 33 extend from the burn in fixture 11. As can be seen in FIG. 2, in the preferred embodiment, the external connector leads 33 are attached to the die cavity plate 13, and extend therefrom. The external connector leads 33 are shown as connector pins, which preferably are in a DIP (dual inline plug) or QFP (quad flat pack) configuration.

The external connector leads 33 are secured by the die cavity plate 13 and terminate on the die cavity plate 13 with contact pads 37. The contact pads 37 are in approximate planar alignment with the bondpads 27.

Figure 3:
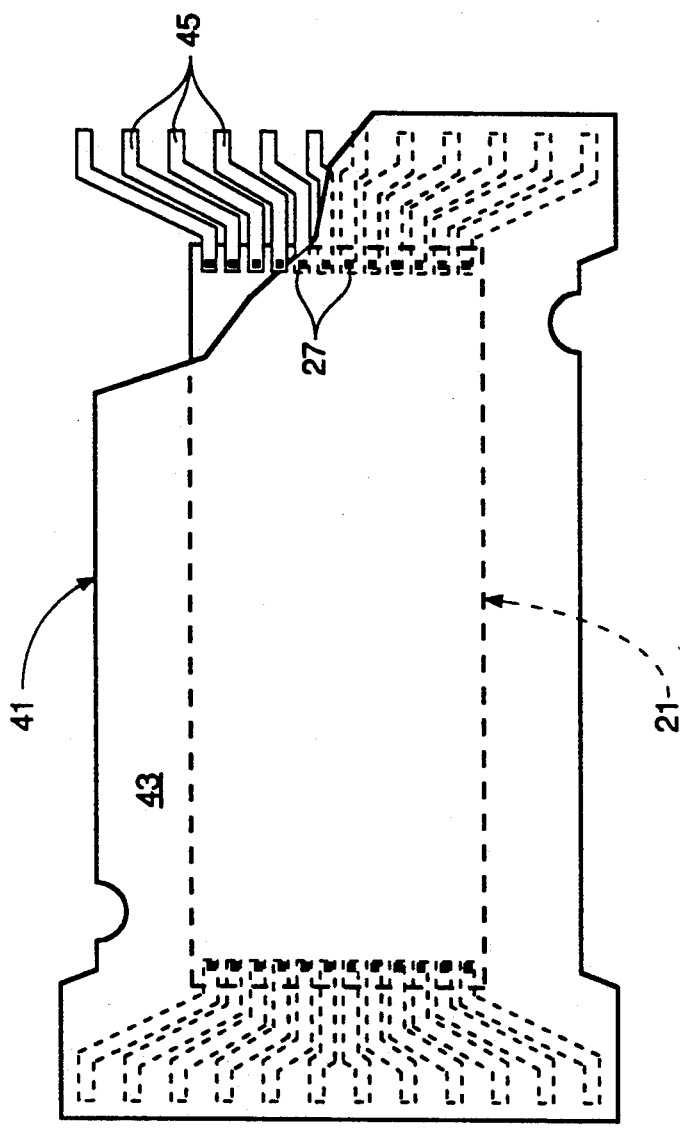
FIG. 3 shows details of non-bonded TAB tape used with the invention.

Referring to FIGS. 1 and 2, contact between the bondpads 27 and the external connector leads 33 is established by non-bonded TAB (tape automated bonding) tape 41, shown in FIG. 3.

The non-bonded TAB tape 41 is essentially similar to conventional TAB tape methods, except that its connection function may be performed without bonding the TAB tape 41 to the die 21. In order to maintain contact with the bondpads 27, the non-bonded TAB tape 41 is biased against the die 21 when the burn-in/test fixture 11 is assembled. This enables the non-bonded TAB tape 41 to be lifted from the die 21 without destroying the bondpads 27.

The non-bonded TAB tape 41 includes a plastic film 43, preferably formed of polyamide, onto which are formed a plurality of conductive traces 45. The conductive traces 45 have bumps 47, 48 which are intended for registration with a bondpad 27 or a contact pad 37. The conductive traces 45 therefore are able to conduct signals between the bondpads 27 and the contact pads 37.

It is possible to bond the TAB tape 41 to the bondpads 27, if such a bond could be made reversible. That would require that the bond be generally weaker than the attachment of the bondpad 27 to the die 21. This would necessitate a weak bond, or an other means to permit the die to be separated from the fixture 11.

It is also possible to permanently bond the TAB tape 41 to the die 21, and to retain the attachment to the TAB tape 41 to the die 21 subsequent to burn in.

The cover 15 includes a rigid cover plate 51 and a resilient compressible elastomeric strip 53, which serves as a biasing member 53. When the cover plate 51 is secured to the die cavity plate 13, the resilient biasing member 53 biases the non-bonded TAB tape 41 against the die 21. This establishes an ohmic contact between the bondpads 27 and the conductive traces on the non-bonded TAB tape 41, without the TAB tape 41 being bonded to the bondpads 27.

The non-bonded contact of the non-bonded TAB tape 41 applies primarily to the bondpads 27. Contact between the TAB tape 41 and the contact pads 37 on the fixture 11 may be effected by bonding techniques. Such bonding is not expected to deteriorate the fixture 11, even though the fixture is used multiple times. If bonding is used for such contact, then the conductive material from the TAB tape may remain with the fixture 11, but without detriment to the operation of the fixture 11.

Positioning pins 57 are used to align the cover plate 51 with the die cavity plate 13. A clamp 61 then secures the cover plate 51 in place over the die cavity plate 13. The clamp 61 may consist of a wire clasp which may either be latched into place against itself, as shown, or is fitted into parallel horizontal locations in the die cavity plate 13 and the cover plate 51. With the cover plate 51 in place, conductors on the non-bonded TAB tape 41 extend from the bondpads 27 to the contact pads 37, so that the bondpads 27 are in electrical communication with the external connector leads 33.

Figure 4:
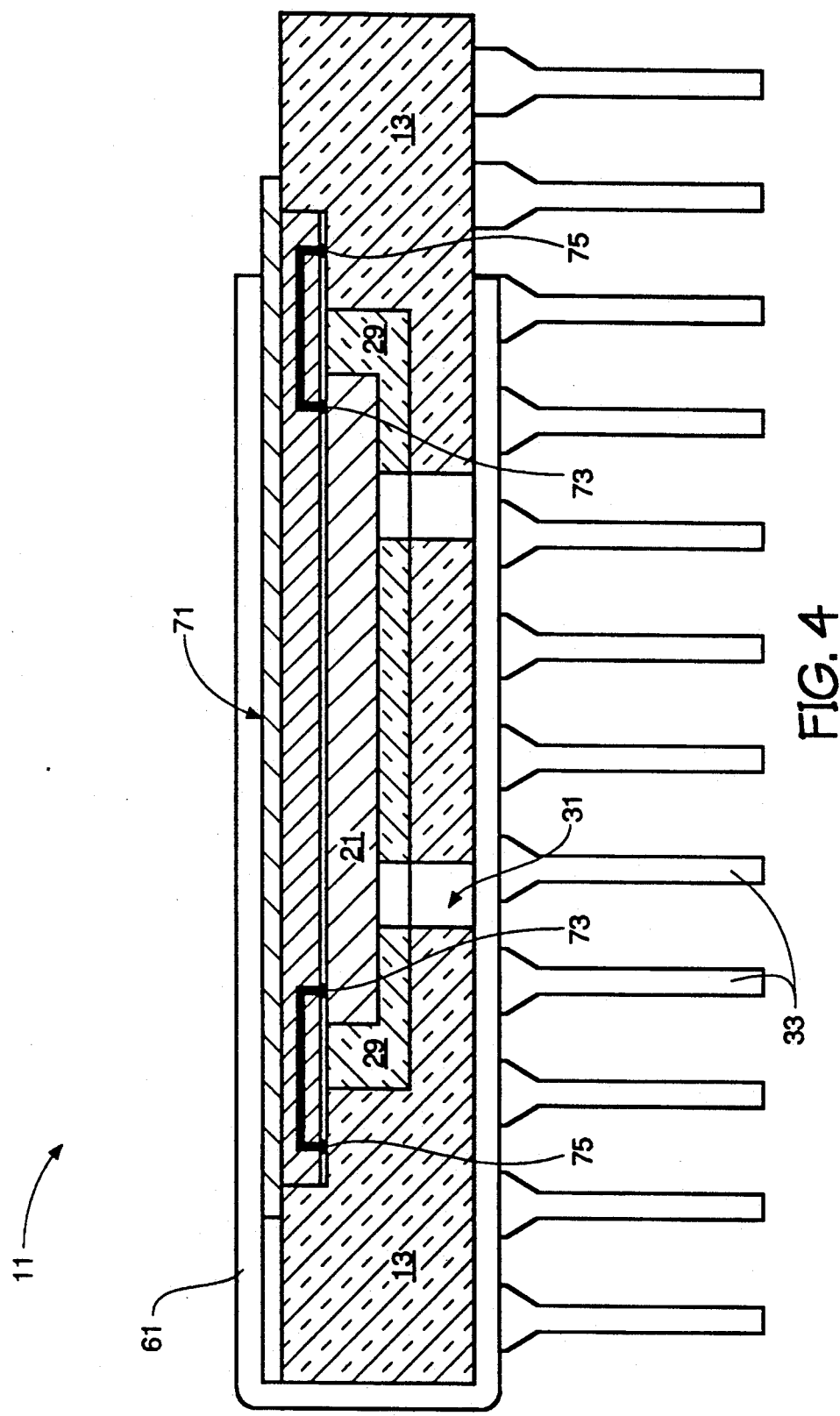
FIG. 4 shows a modification to the embodiment of FIGS. 1 and 2, in which a modified cover plate has conductive polymer contacts.

FIG. 4 shows a modification to the embodiment of FIGS. 1 and 2, in which a modified cover plate 71 uses conductive polymer contacts 73 in order to establish contact with the bondpads 27. Contact with the external connector leads 33 is established by electrical contacts 75 on the cover plate 71, and these contacts 75 may be either conductive polymer or metallic.

Figure 5:
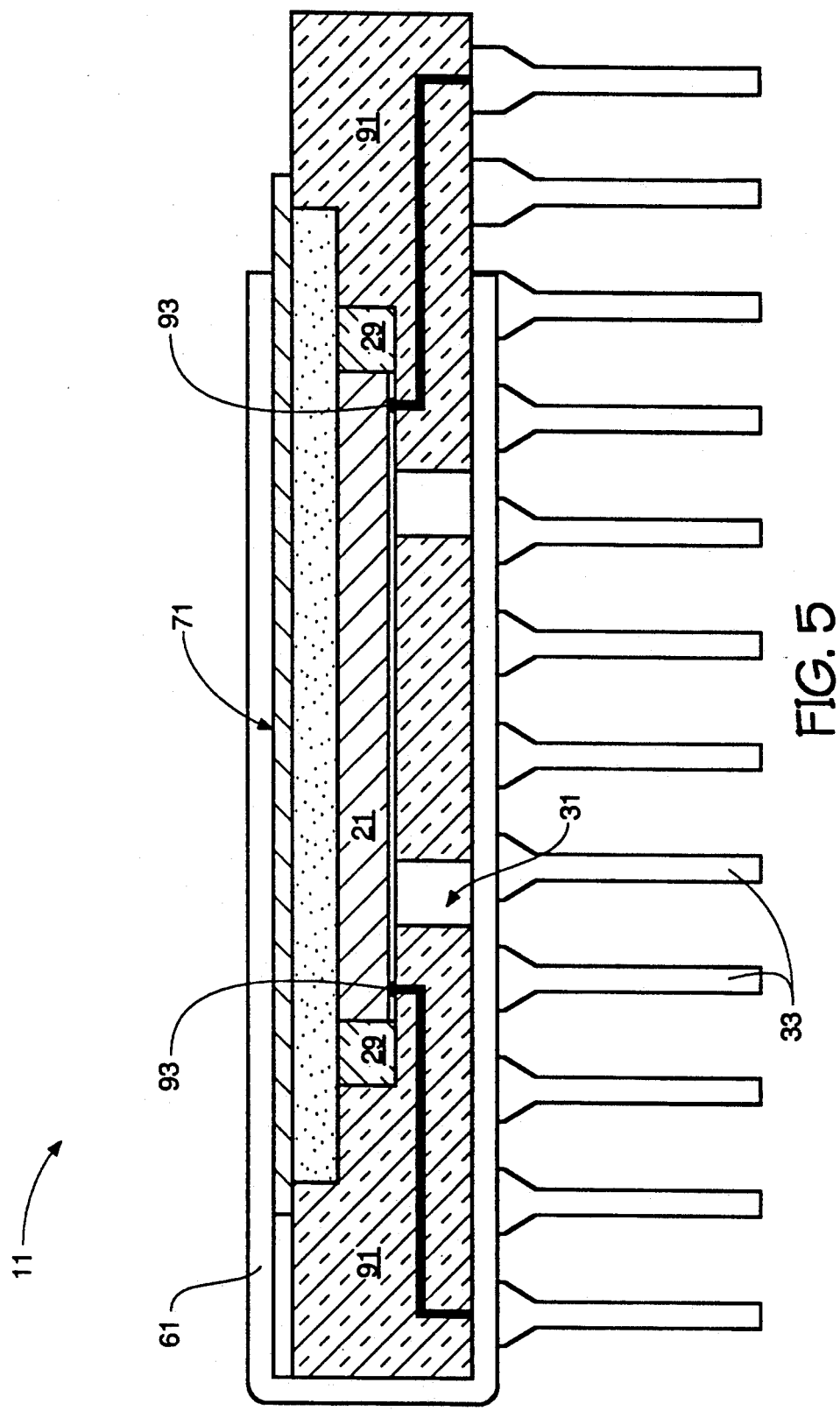
FIG. 5 shows an embodiment in which a die cavity housing is used for connections between the die and external connection pins.

FIG. 5 shows an embodiment in which a die cavity housing 91 has conductive polymer contacts 93. The die 21 is placed face down, so as to establish connection between the bondpads 27 and the polymer contacts 93.

Figure 6:
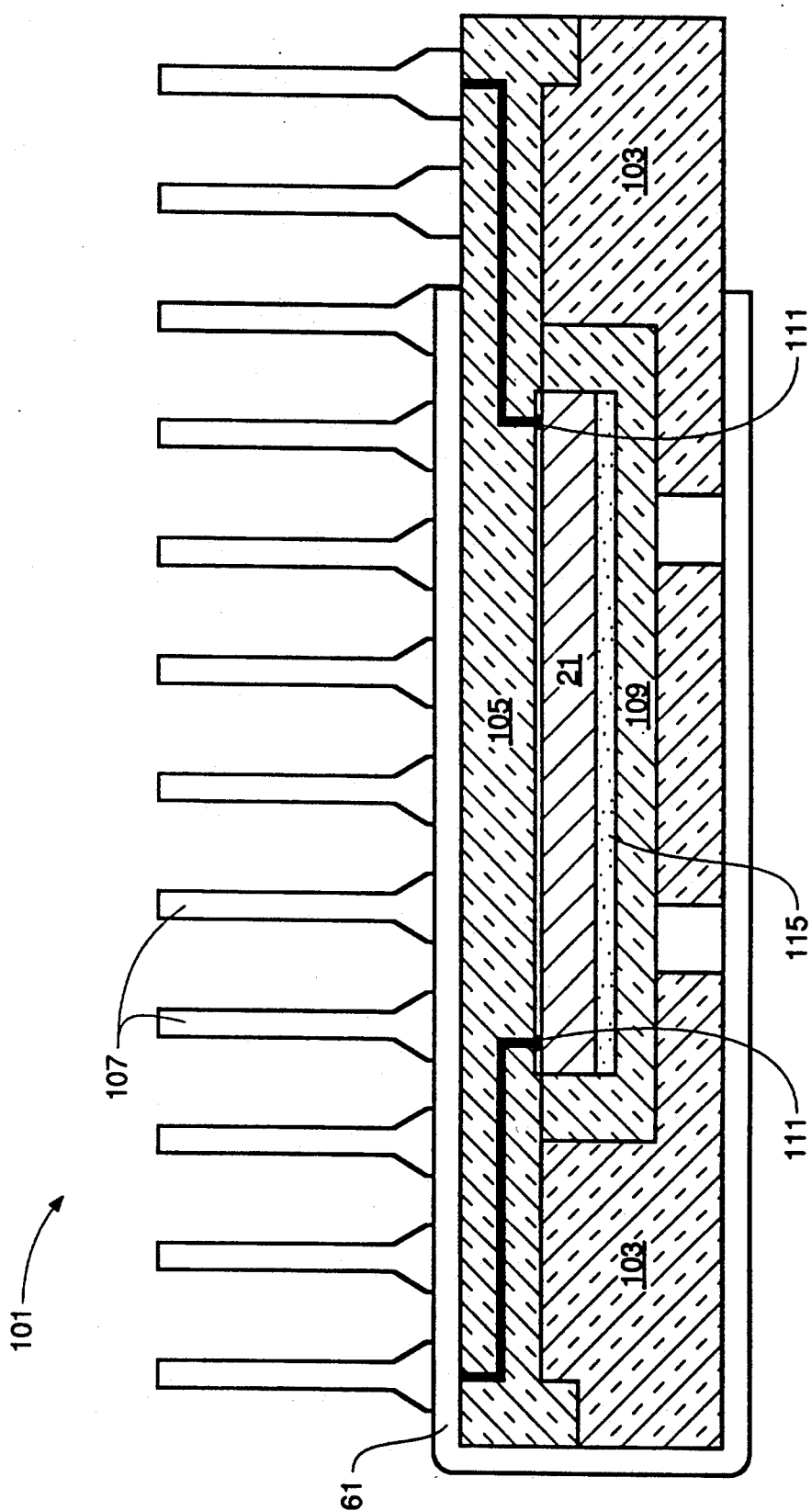
FIG. 6 shows an alternate embodiment of a test package, in which an upper portion is used to connect the die to external test circuitry.

In an alternate embodiment of a package 101, shown in FIG. 6, a die receiving housing 103 is used to retain a die 21, and an upper portion 105 is used to connect the die 21 to external test circuitry, by the use of external connector pins 107. The die receiving housing 103 contains a die receiving cavity 109, which supports the die 21 in alignment with electrical contacts 111 which contact bondpads 27 on the die 21. A biasing plate 115 biases the die 21 against the contacts 111. In one embodiment of this configuration, the contacts 111 are metallic, although other conductors may be used for the contacts 111. As an example, it is possible to use conductive polymer for the contacts 111.

Figure 7:
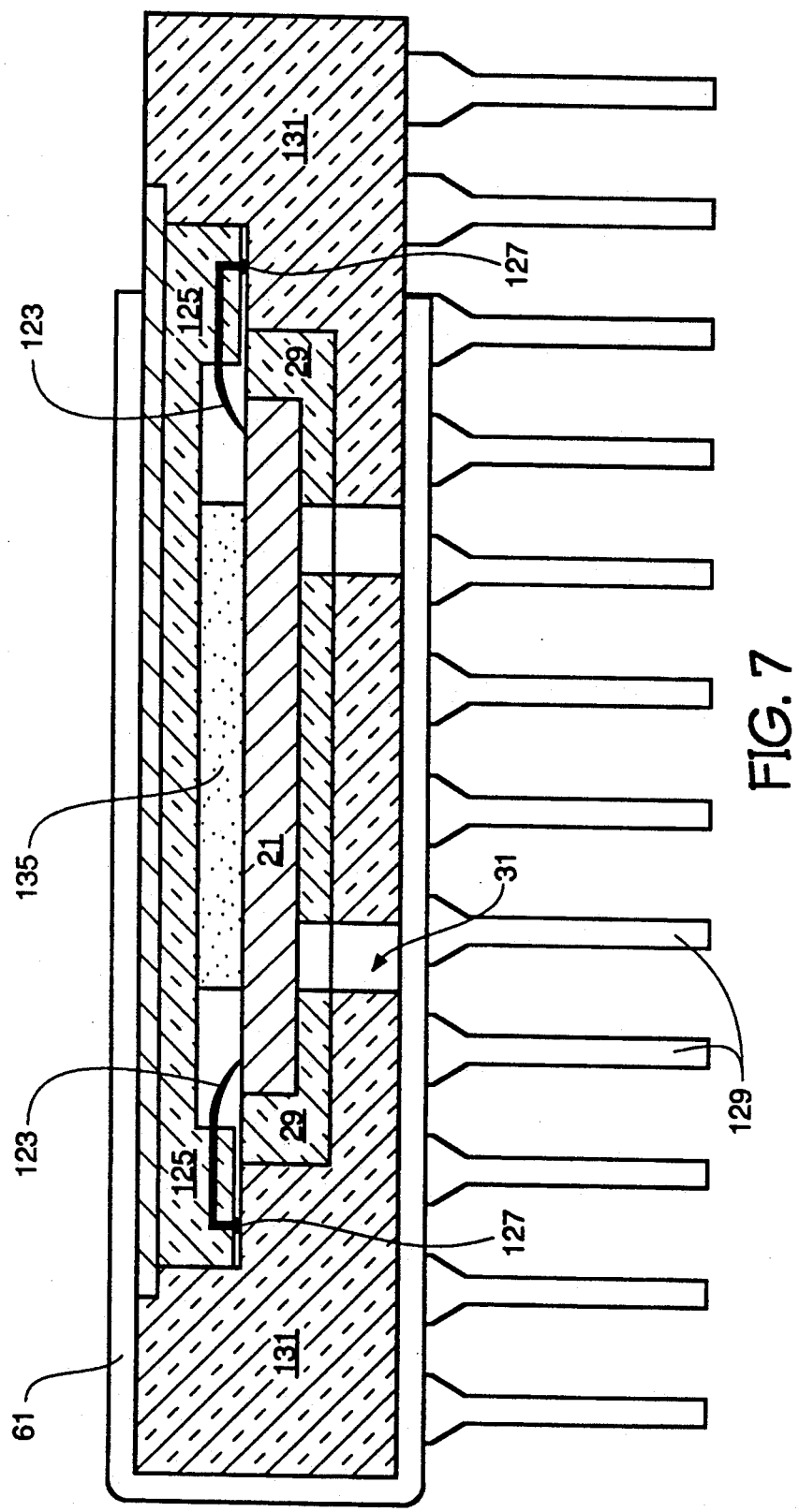
FIG. 7 shows a modification to the embodiment of FIGS. 1 and 2, in which contact pins are used for connections between the die and external connection pins.

In an embodiment shown in FIG. 7, contact pins 123 are used to connect to the bondpads 27 on the die 21. The contact pins 123 are mounted to a dielectric cover 125, and electrical continuity between the contact pins 123 and base portions 127 of external connector pins 129 is established when the cover 125 is mounted to a die cavity housing 131. A resilient pad 135 secures the die 21 in position in the housing 131.

The contacts 123 are pin type contacts, which are similar to probe contacts. Because of the relatively precise alignment of the cover 125 with respect to the die 21, it is possible to design the contacts 123 to have a relatively low biasing force, while still maintaining good ohmic contact between the bondpads 27 and the contacts 123.

Figure 8:
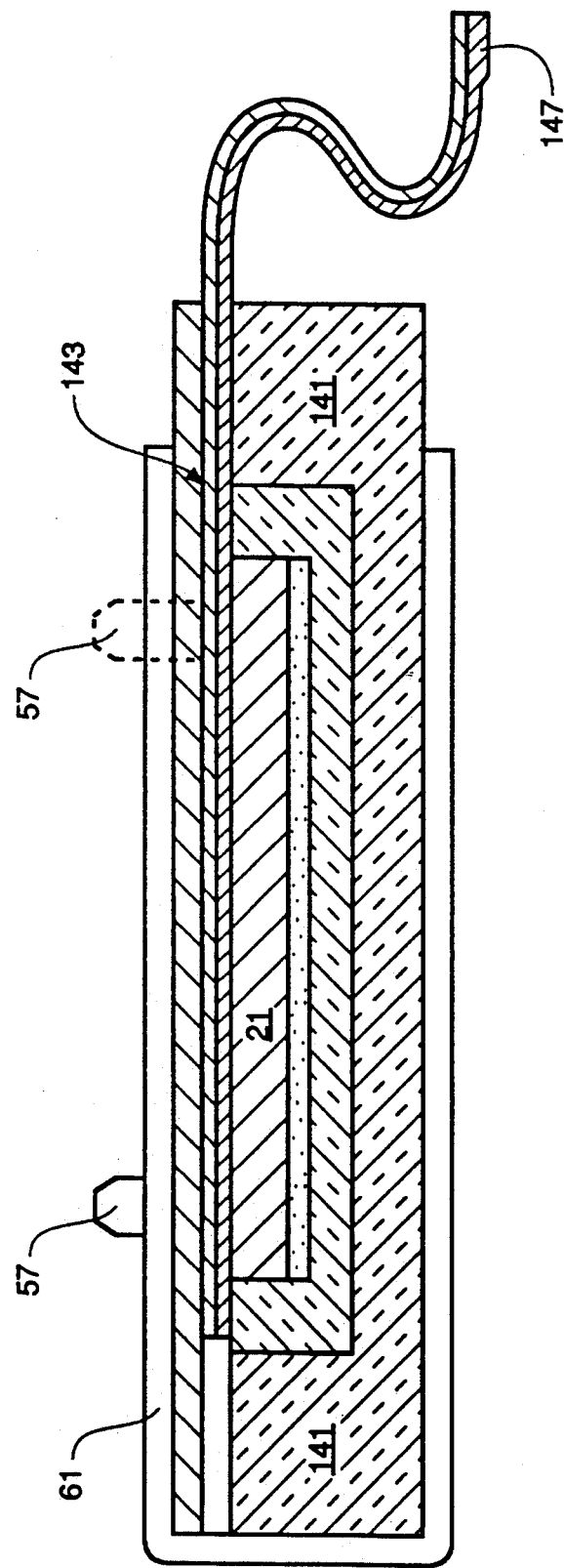
FIG. 8 shows a modification of the invention, in which flexible tape is used to directly connect the die to an external connector connected to external test circuitry.

FIG. 8 shows a configuration in which a housing fixture 141 merely retains the die 21 in a predetermined positional alignment, and in electrical communication with non-bonded TAB tape 143. The TAB tape 143 extends beyond the confines of the fixture 141 and terminates in an external connector 147.

While specific locations for bondpads had not been specified, it is possible to test a variety of configurations, including the conventional arrangement of bondpads at the ends of the die 21. The invention may also be used for testing die configured for LOC (leads over chip), as well as other designs. In each of the above examples, the assembled fixture is adapted into conventional test equipment, such as a burn-in oven. What has been described is a very specific configuration of a test fixture. Clearly, modification to the existing apparatus can be made within the scope of the invention. Accordingly, the invention should be read only as limited by the claims.

We claim:

1. Discrete testing apparatus for testing a semiconductor device in die form, comprising:
   a) a first plate;
   b) a die-receiving cavity in the first plate;
   c) a second plate;
   d) means to secure the first and second plates together;
   e) an insulative substrate, separate from the first and second plates having a plurality of circuit traces thereon and dimensioned so as to fit within said die receiving cavity being received by the die receiving cavity prior to insertion of the die in a position juxtaposed to a face side of the die when the die is in the die receiving cavity, so that the insulative substrate is at least partially contained within the die receiving cavity when the first and second plates are secured together, and means to retain the insulative substrate is received in the die receiving cavity prior to placement of the die into the die receiving cavity;
   f) a plurality of contacts on the plurality of circuit traces, the contacts being positioned so that, when the first plate and the second plate are aligned and the die and the insulative substrate are positioned in the die-receiving cavity, the contacts are in alignment with contact locations on the die;
   g) connector terminals in an electrical communication with the plurality of contacts; and
   h) means to bias the die and the insulative substrate together when the first plate and the second plate are secured together, thereby causing the contacts to be maintained in electrical communication with said contact locations;

i) the means to secure including a clamp, the clamp extending across at least one of the first and second plates to secure the first and second plates together, wherein when the first and second plates are secured together with the die in the die receiving cavity, a plurality of said contact locations are in electrical communication with the connector terminals.

2. Discrete testing apparatus as described in claim 1, further comprising:

the connector terminals being positioned on the second plate so that, when the first plate and the second plate are aligned by the alignment means and the die and the insulative substrate are positioned in the die-receiving cavity, the plurality of contacts are in alignment with contact locations on the die.

3. Discrete testing apparatus as described in claim 2, further comprising:

said clamp consisting of a clasp which may either be latched into place.

4. Discrete testing apparatus as described in claim 1, further comprising:

the die receiving cavity having a biased platform therein, the biased platform exerting a biasing force against the die, the biasing force being sufficiently uniform to cause the die to establish contact with the plurality of contacts.

5. Discrete testing apparatus as described in claim 1, further comprising:

means to bias die received in the die receiving cavity with the plurality of contacts after the first and second plates have been mated.

6. Discrete testing apparatus as described in claim 5, further comprising:

the external connector leads being secured by the die cavity plate and terminating on the die cavity plate as contact pads, the contact pads being in approximate planar alignment with the contact location on the die.

7. Discrete testing apparatus as described in claim 1, further comprising:

the plurality of contacts including contact pads which are in alignment with the die receiving cavity after the first and second plates have been mated.

8. Discrete testing apparatus as described in claim 1, further comprising:

the plurality of contacts including a contact pads which are in alignment with the die receiving cavity after the first and second plates have been mated.

9. Discrete testing apparatus as described in claim 1, further comprising:

said clamp consisting of a clasp which is latched into place.

10. Discrete testing apparatus for testing a semiconductor device in die form, comprising:

a) a first plate;
b) a die-receiving cavity in the first plate;
c) a second plate;
d) means to secure the first and second plates together;
e) an insulative substrate, separate from the first and second plates having a plurality of circuit traces thereon and dimensioned so as to fit within said die receiving cavity in a position juxtaposed to a face side of the die when the die is in the die receiving cavity, so that the insulative substrate is at least partially contained within the die receiving cavity when the first and second plates are secured together;
f) a plurality of contacts on the plurality of circuit traces, the contacts being positioned so that, when the first plate and the second plate are in alignment, and the die is positioned in the die-receiving cavity, the contacts are in alignment with contact locations on the die;
g) connector terminals in electrical communication with the contacts; and
h) means to bias the die and the insulative substrate together when the first plate and the second plate are secured together, thereby causing the contacts to be maintained in electrical communication with said contact locations;
i) the means to secure including a clamp, the clamp extending across at least one of the first and second plates to secure the first and second plates together, wherein when the first and second plates are secured together with the die in the die receiving cavity, a plurality of said contact locations are in electrical communication with the connector terminals.

11. Discrete testing apparatus as described in claim 10, further comprising:

said plurality of contacts on the plurality of conductors being mounted to an insulative substrate, the insulative substrate being supported by the first and second plates when the first and second plates are secured together.

12. Discrete testing apparatus as described in claim 10, further comprising:

a spacer plate which fits within the die receiving cavity and the die, and which precisely positions the die for subsequent alignment.

13. Discrete testing apparatus as described in claim 12, further comprising:

a slot in the die cavity plate, for facilitating lifting the die out of the die receiving cavity.

14. Discrete testing apparatus as described in claim 10, further comprising:

the connector terminals in electrical communication with the plurality of contacts comprising a plurality of external connector leads attached to the die cavity plate, and extending from the burn in fixture.

15. Discrete testing apparatus as described in claim 14, further comprising:

said connector terminals extending from the burn in fixture in standard semiconductor package configuration.

16. Discrete testing apparatus as described in claim 10, further comprising:

contact between the contact locations on the die for said electrical communication with the contact terminals being established by TAB (tape automated bonding) tape which is not bonded with the die at the contact locations.

17. Discrete testing apparatus as described in claim 10, further comprising:

the plurality of contacts being conductive polymer contacts.

18. Discrete testing apparatus as described in claim 10, further comprising:

the plurality of contacts being positioned on the insulative substrate so that, when the die and the insulative substrate are positioned in the die receiving cavity, the plurality of contacts are between the die and the second plate.

19. Discrete testing apparatus as described in claim 18, further comprising:
the plurality of contacts being located in the die cavity housing.

20. Discrete testing apparatus as described in claim 10, further comprising:
the plurality of contacts being conductive soft metal contacts.

21. Discrete testing apparatus as described in claim 18, further comprising:
a) the plurality of contacts being positioned on the insulative substrate so that, when the die and the insulative substrate are positioned in the die receiving cavity, the plurality of contacts are between the die and the second plate;
b) one of said first and second plates being a cover plate, the cover plate supporting said plurality of contacts;
c) the first plate including a resilient compressible elastomeric strip, the rigid elastomeric strip biasing the plurality of contacts against the die, thereby establishing an ohmic contact between the die contact locations and the plurality of contacts.

22. Discrete testing apparatus as described in claim 10, further comprising:
a) the cover plate including a dielectric cover; and
b) the plurality of contacts being contact pins which are mounted to the dielectric cover.

23. Discrete testing apparatus as described in claim 10, further comprising:
a) contact between the contact locations on the die for said electrical communication with the contact terminals being established by TAB (tape automated bonding) tape which is not bonded with the die at the contact locations; and
b) the TAB tape extending beyond the confines of a fixture formed by the first and second plates and terminating in an external connector, the external connector including said connector terminals.

24. Discrete testing apparatus as described in claim 10, further comprising:
the plurality of contacts including a flexible rods which extend into the die receiving cavity after the first and second plates have been mated.

25. Discrete testing apparatus as described in claim 10, further comprising:
said clamp consisting of a clasp which is latched into place.

26. Discrete testing apparatus for testing a semiconductor device in die form, comprising:
a) a first plate;
b) a die-receiving cavity in the first plate;
c) a second plate;
d) means to secure the first and second plates together;
e) an insulative substrate, separate from the first and second plates with a plurality of circuit traces thereon, the plurality of circuit traces being dimensioned so as to fit within said die receiving cavity adjacent to the die when the die is in the die receiving cavity, so that the insulative substrate is at least partially contained within the die receiving cavity when the first and second plates are secured together;
f) a plurality of contacts on the plurality of circuit traces, the contacts being positioned so that, when the first plate and the second plate are in alignment, and the die is positioned in the die-receiving cavity, the contacts are in alignment with contact locations on the die;
g) connector terminals in electrical communication with the contacts; and
h) means to bias the die and the insulative substrate together when the first plate and the second plate are secured together, thereby causing the contacts to be maintained in electrical communication with said contact locations, contact between the contact locations on the die for said electrical communication with the connector terminals being established without bonding the contacts with the die at the contact locations;
i) the second plate including a rigid cover plate and a resilient compressible elastomeric strip, said elastomeric strip biasing the insulative substrate against the die, thereby establishing an ohmic contact between the die contact locations and conductive traces on the insulative substrate;
j) the means to secure including a clamp, the clamp extending across at least one of the first and second plates to secure the first and second plates together, wherein
when the first and second plates are secured together with the die in the die receiving cavity, a plurality of said contact locations are in electrical communication with the connector terminals.

27. Discrete testing apparatus as described in claim 26, further comprising:
the connector terminals being positioned on the second plate so that, when the first plate and the second plate are aligned by the alignment means and the die and the insulative substrate are positioned in the die-receiving cavity, the plurality of contacts are in alignment with contact locations on the die.

28. Discrete testing apparatus as described in claim 26, further comprising:
the biasing force exerted by the biased platform being sufficiently uniform to cause the die to establish contact with the plurality of contacts.

29. Discrete testing apparatus as described in claim 26, further comprising:
the plurality of contacts including contact pads which are in alignment with the die receiving cavity after the first and second plates have been mated.

30. Discrete testing apparatus as described in claim 26, further comprising:
a spacer plate which fits within the die receiving cavity and the die, and which precisely positions the die for subsequent alignment.

31. Discrete testing apparatus as described in claim 30, further comprising:
a slot in the die cavity plate, for facilitating lifting the die out of the die receiving cavity.

32. Discrete testing apparatus as described in claim 26, further comprising:
the connector terminals in electrical communication with the plurality of contacts comprising a plurality of external connector leads attached to the die cavity plate, and extending from the burn in fixture.

33. Discrete testing apparatus as described in claim 32, further comprising:
said connector terminals extending from the burn in fixture in a standard semiconductor package configuration.

34. Discrete testing apparatus as described in claim 26, further comprising:
   contact between the contact locations on the die for said electrical communication with the contact terminals being established by TAB (tape automated bonding) tape which is not bonded with the die at the contact locations.

35. Discrete testing apparatus as described in claim 34, further comprising:
   the second plate including a rigid cover plate and a resilient compressible elastomeric strip, the rigid elastomeric strip biasing the TAB tape against the die, thereby establishing an ohmic contact between the die contact locations and conductive traces on the TAB tape.

36. Discrete testing apparatus as described in claim 26, further comprising:
   the plurality of contacts being conductive polymer contacts.

37. Discrete testing apparatus as described in claim 26, further comprising:
   the plurality of contacts being positioned on the insulative substrate so that, when the die and the insulative substrate are positioned in the die receiving cavity, the plurality of contacts are between the die and the second plate.

38. Discrete testing apparatus as described in claim 37, further comprising:
   the plurality of contacts being located in the die cavity housing.

39. Discrete testing apparatus as described in claim 26, further comprising:
   the plurality of contacts being conductive soft metal contacts.

40. Discrete testing apparatus as described in claim 39, further comprising:
   the plurality of contacts being positioned on the insulative substrate so that, when the die and the insulative substrate are positioned in the die receiving cavity, the plurality of contacts are between the die and the second plate;
   b) the cover plate supports said plurality of contacts; and
   c) the first plate including a resilient compressible elastomeric strip, the rigid elastomeric strip biasing the plurality of contacts against the die, thereby establishing an ohmic contact between the die contact locations and the plurality of contacts.

41. Discrete testing apparatus as described in claim 26, further comprising:
   a) the cover plate including a dielectric cover; and
   b) the plurality of contacts being contact pins which are mounted to the dielectric cover.

42. Discrete testing apparatus as described in claim 26, further comprising:
   a) contact between the contact locations on the die for said electrical communication with the contact terminals being established by TAB (tape automated bonding) tape which is not bonded with the die at the contact locations; and
   b) the TAB tape extending beyond the confines of a fixture formed by the first and second plates and terminating in an external connector, the external connector including said connector terminals.

43. Discrete testing apparatus as described in claim 26, further comprising:
   said clamp consisting of a clasp which is latched into place.

* * * * *